United States Patent
Urayama et al.

(10) Patent No.: US 8,173,487 B2
(45) Date of Patent: May 8, 2012

(54) SEMICONDUCTOR ELEMENT, METHOD FOR MANUFACTURING SAME, AND ELECTRONIC DEVICE INCLUDING SAME

(75) Inventors: Masao Urayama, Osaka (JP); Masashi Kawasaki, Sendai (JP); Hideo Ohno, Sendai (JP)

(73) Assignees: Sharp Kabushiki Kaisha, Osaka-Shi, Osaka (JP); Tohoku University, Sendai-Shi, Miyagi (JP)

( * ) Notice: Subject to any disclaimer, the term of this patent is extended or adjusted under 35 U.S.C. 154(b) by 155 days.

(21) Appl. No.: 12/530,552

(22) PCT Filed: Apr. 1, 2008

(86) PCT No.: PCT/JP2008/056501
§ 371 (c)(1),
(2), (4) Date: Sep. 9, 2009

(87) PCT Pub. No.: WO2008/126729
PCT Pub. Date: Oct. 23, 2008

(65) Prior Publication Data
US 2010/0044702 A1    Feb. 25, 2010

(30) Foreign Application Priority Data
Apr. 6, 2007   (JP) .................................. 2007-101133

(51) Int. Cl.
H01L 29/12   (2006.01)
H01L 21/20   (2006.01)
(52) U.S. Cl. .................... 438/104; 438/510; 438/922
(58) Field of Classification Search .................... 257/43; 438/914–925
See application file for complete search history.

(56) References Cited

U.S. PATENT DOCUMENTS

| | | | |
|---|---|---|---|
| 4,082,889 A * | 4/1978 | DiStefano | 428/328 |
| 6,168,731 B1 * | 1/2001 | Hampden-Smith et al. | 252/301.4 S |
| 6,727,522 B1 | 4/2004 | Kawasaki et al. | |
| 2001/0024084 A1 * | 9/2001 | Kajiwara | 313/486 |

(Continued)

FOREIGN PATENT DOCUMENTS

JP   5-251357   9/1993
(Continued)

OTHER PUBLICATIONS

International Search Report for PCT/JP2008/056501, mailed Jul. 1, 2008.

*Primary Examiner* — Minh-Loan T Tran
*Assistant Examiner* — William Harriston
(74) *Attorney, Agent, or Firm* — Nixon & Vanderhye P.C.

(57) ABSTRACT

A thin-film transistor (1) of the present invention includes an insulating substrate (2), a gate electrode (3) which has a predetermined shape and is formed on the insulating substrate (2), a gate insulating film (4) formed on the gate electrode (3), and a semiconductor layer (5) which is polycrystalline ZnO and is formed on the gate insulating film (4). The semiconductor layer (5) is immersed in a solution in which impurities are dissolved so that the impurities are selectively added to a grain boundary part of the polycrystalline ZnO film. Subsequently, a source electrode (6) and a drain electrode (7) are formed so as to have a predetermined shape. Next, a protection layer (8) is formed on the source electrode (6) and the drain electrode (7). Thus, a thin-film transistor which has a good subthreshold characteristic and has a zinc oxide film as a base of an active layer can be realized.

2 Claims, 8 Drawing Sheets

U.S. PATENT DOCUMENTS

| | | | |
|---|---|---|---|
| 2002/0011777 A1* | 1/2002 | Konishi et al. | 313/495 |
| 2002/0187895 A1* | 12/2002 | Izaki et al. | 502/330 |
| 2003/0047785 A1 | 3/2003 | Kawasaki et al. | |
| 2005/0062134 A1* | 3/2005 | Ho et al. | 257/614 |
| 2005/0127380 A1 | 6/2005 | Kawasaki et al. | |
| 2006/0108636 A1 | 5/2006 | Sano et al. | |
| 2006/0202203 A1* | 9/2006 | Chen et al. | 257/59 |
| 2006/0228887 A1* | 10/2006 | Thirukkovalur et al. | 438/674 |
| 2006/0270197 A1 | 11/2006 | Ho et al. | |
| 2008/0296569 A1 | 12/2008 | Ho et al. | |
| 2009/0200541 A1* | 8/2009 | Herman et al. | 257/24 |

FOREIGN PATENT DOCUMENTS

| | | |
|---|---|---|
| JP | 2002-76356 | 3/2002 |
| JP | 2005-171359 | 6/2005 |

* cited by examiner

SEMICONDUCTOR ELEMENT, METHOD FOR MANUFACTURING SAME, AND ELECTRONIC DEVICE INCLUDING SAME

TECHNICAL FIELD

The present invention relates to (i) a semiconductor element, (ii) a method for manufacturing the semiconductor element, and (iii) an electronic device including the semiconductor element. The present invention especially relates to (i) a semiconductor element which has a zinc oxide film serving as a base of an active layer, (ii) a method for manufacturing the semiconductor element, and (iii) an electronic device including the semiconductor element.

BACKGROUND ART

In recent years, there has been rapidly expanded in use of a flat panel display (FPD) device such as a liquid crystal display device or an organic EL (electroluminescence) display device. Among them, an active matrix display device is exemplified as a flat panel display device which can carry out a high grade display.

The active matrix display device adopts amorphous silicon TFTs (Thin-Film Transistors) or polysilicon TFTs (Thin-Film Transistors). Such amorphous silicon TFTs (Thin-Film Transistors) and polysilicon TFTs have optical sensitivity in a visible region. Therefore, carriers are generated while the amorphous silicon TFTs and the polysilicon TFTs are irradiated by light. This causes a reduction in resistance of such TFTs, thereby giving rise to a deterioration in displaying quality of the active matrix display device. In order to prevent such a deterioration in displaying quality, the active matrix display device adopts an arrangement in which a light-blocking layer (e.g. metal coated layer) for blocking incident light is included. This prevents a change in resistance. However, since the arrangement causes a reduction in effective displaying area, it is necessary for a backlight to emit brighter light. This brings about a new problem of a deterioration in efficiency of energy use. In view of the circumstances, developments of a transparent transistor have been promoted which does not have optical sensitivity in the visible region and can be used as a transistor for use in a device such as the active matrix display device.

Such a transistor adopts a transparent active layer which is made of a material such as zinc oxide (ZnO), zinc magnesium oxide ($Mg_xZn_{1-x}O$), zinc cadmium oxide ($Cd_xZn_{1-x}O$), or cadmium oxide (CdO). Especially, a transistor attracts attention whose active layer is made of zinc oxide since the zinc oxide is a semiconductor which shows a relatively good physical property during a manufacturing step at a low temperature. However, a transistor whose active layer is made of zinc oxide alone would not have a transistor characteristic sufficient to come in practice. In view of this, a technique has been developed to improve a transistor characteristic, by adding impurities to a zinc oxide film. For example, Patent Literatures 1 through 3 disclose this kind of technique.

The Patent Literature 1 teaches that a transistor is made transparent by using (i) a channel layer made of a transparent semiconductor such as ZnO and (ii) a gate insulating layer made of a transparent insulating material such as insulating ZnO to which a univalent or a pentavalent element is added.

The Patent Literature 2 teaches that a channel layer can have a high resistance by adding a 3d transition metal element (e.g., Ni) to a transparent channel material (e.g., ZnO) and it is possible to realize a high-efficiency thin-film transistor which has a good on-off ratio and mobility even if a thin film is formed at a relatively low temperature (e.g., at room temperature).

The Patent Literature 3 discloses a method for manufacturing an active layer of a thin-film transistor element, in which (i) an active layer is formed with the use of a ZnO precursor solution, to which a dopant is added in advance, by means of a chemical bath deposition method, a photochemical deposition method, or a sol-gel process, and (ii) the dopant is concurrently added to the active layer. The Patent Literature 3 teaches that the method makes it possible to realize a thin-film transistor which can be operated under high pressure and has a good element characteristic. In addition, a valence VIA element such as S is disclosed as the dopant.

Further, there is another problem that a transistor whose active layer is made of a polycrystalline film may have a deteriorated transistor characteristic due to grain boundary of the polycrystalline. This necessitates suppression of an influence of such a grain boundary on a transistor characteristic. In view of this, for example, a polycrystalline silicon transistor which comes in practice as a transistor whose active layer is made of a polycrystalline film employs an SOI technique in which a polycrystalline or amorphous silicon in the active layer is irradiated by a laser beam so as to be transformed into a monocrystalline silicon.

CITATION LIST

Patent Literature 1

Japanese Patent Application Publication, Tokukai, No. 2000-150900 A (Publication Date: May 30, 2000)

Patent Literature 2

Japanese Patent Application Publication, Tokukai, No. 2002-076356 A (Publication Date: Mar. 15, 2002)

Patent Literature 3

Japanese Patent Application Publication, Tokukai, No. 2005-093974 A (Publication Date: Apr. 7, 2005)

SUMMARY OF INVENTION

As described above, attempts have been made to improve characteristics of a transistor in which a ZnO film is used as a transparent active layer, by adding impurities to the ZnO film. However, each of the Patent Literatures 1 through 3 does not address anything about the suppression of influence of a grain boundary on a transistor characteristic. That is, according to the technique disclosed in the Patent Literatures 1 through 3, it is not possible to suppress a deterioration in transistor characteristic due to a grain boundary, in a case where an active layer is made of a polycrystalline ZnO film.

Further, since zinc oxide has a high melting point of 2000° C., it is difficult to obtain a crystallized thin zinc oxide film unlike silicon. That is, in a case where a polycrystalline ZnO film is used as an active layer, it is not possible for the SOI technique to suppress a deterioration in transistor characteristic due to a grain boundary.

As described above, the conventional art cannot suppress a deterioration in transistor characteristic due to a grain boundary in a case where a polycrystalline ZnO film is used as an active layer. In view of this, it is needed to develop a technique for suppressing a deterioration in transistor characteristic due to a grain boundary, in a case where a polycrystalline ZnO film is used as an active layer.

The present invention was attained in view of the above problems. An object of the present invention is to provide (i) a semiconductor element which has a good subthreshold property, has a zinc oxide film as a base of an active layer, and can be used as a thin-film transistor; (ii) a method for manufacturing the semiconductor element; and (iii) an electronic device including the semiconductor element.

In order to attain the above object, a semiconductor element of the present invention includes an active layer made of a polycrystalline ZnO film to which impurities are added, the impurities being added more in concentration to a grain boundary part of the active layer than to a crystal part of the active layer.

According to the above arrangement, the impurities are combined with Zn dangling bonds of the polycrystalline ZnO film so that bonds between the impurities and Zn are formed. This causes an energy level of a trap level to be shifted to a higher energy side. As such, the trap level is hidden from carriers. Thus, the carriers are not influenced by the trap level. In other words, the energy level of the trap level formed on the grain boundary is controlled so that the trap level can be shifted to a level which does not influence an energy level of the carriers. This makes it possible to reduce the influence of the grain boundary on operation of a semiconductor element, thereby allowing an improvement in TFT characteristic of the semiconductor element such as electron field-effect mobility and subthreshold coefficient S.

In the semiconductor element, it is preferable that the impurities are sulfur.

According to the above arrangement, the grain boundary part of the active layer contains a larger amount of ZnS than the crystal part of the active layer. ZnO has an energy bandgap of 3.2 eV, whereas ZnS has an energy bandgap of 3.6 eV. That is, ZnS has a larger energy bandgap than ZnO. Therefore, the above arrangement allows the trap level formed on the grain boundary to be raised to be within the conduction band. This eliminates the influence of the trap level on the carriers, thus allowing an improvement in subthreshold characteristic of the semiconductor element.

In the semiconductor element, it is preferable that the polycrystalline ZnO film has a thickness of less than 25 nm.

The above arrangement allows the impurities to be more effectively taken in the polycrystalline ZnO film, thus allowing the impurities to be added more in concentration to the grain boundary part of the active layer.

It is preferable that the semiconductor element is a thin-film transistor.

According to the above arrangement, the thin-film transistor includes an improvement in electron field-effect mobility and subthreshold coefficient S. In view of this, in a case where the thin-film transistor is used as an active matrix element such as a liquid crystal display element driven at high speed or an organic EL display element driven at high speed, the active matrix element includes an improvement in display performance.

In order to attain the above object, a method for manufacturing a semiconductor element, includes the steps of: forming a polycrystalline ZnO film, and forming an active layer by adding impurities to the polycrystalline ZnO film so that the impurities are added more in concentration to a grain boundary part than to a crystal part.

According to the above arrangement, after formation of a polycrystalline ZnO film, an active layer is formed by adding impurities to the polycrystalline ZnO film. The grain boundary part of the polycrystalline ZnO film is structurally weak since a lattice is not fully developed in the grain boundary part. Therefore, when the impurities are added to the polycrystalline ZnO film, the impurities is more likely to be taken in the grain boundary part than in a crystal part. Further, Zn dangling bonds exist in the grain boundary part, whereas Zn is combined with O in the crystal part of the polycrystalline ZnO film, Therefore, energy for severing Zn—O bonds is required so that the impurities are bonded with Zn. Therefore, according to the above arrangement, the active layer is formed so that the impurities are added more in concentration to the grain boundary part than to the crystal part. This makes it possible to control an energy level of a trap level formed on the grain boundary of the active layer. In other words, it is possible to shift the trap level to a level which does not influence an energy level of the carriers. This makes it possible to reduce the influence of the grain boundary of the active layer on operation of a semiconductor element, thus allowing an improvement in TFT characteristic of the semiconductor element.

In the method for manufacturing a semiconductor element, it is preferable that the active layer is formed by immersing the polycrystalline ZnO film in a solution containing the impurities which are being ionized so that the impurities are added more in concentration to the grain boundary part than to the crystal part.

According to the above arrangement, the ionized impurities is added more in concentration to the grain boundary which has low crystallinity in the polycrystalline ZnO film. As such, it is possible to intensively add the impurities to the grain boundary part of the active layer. In other words, the impurities of high concentration are added to the grain boundary part of the active layer. This makes it possible to further reduce the influence of the grain boundary of the active layer on operation of a semiconductor element, thus allowing an improvement in TFT characteristic of the semiconductor element.

In the method for manufacturing a semiconductor element, it is preferable that the active layer is formed by a chemical bath deposition method so that the impurities are added more in concentration to the grain boundary part than to the crystal part.

The above arrangement allows the impurities to be introduced as ion into the solution. This allows the impurities to be intensively and effectively added to the grain boundary part of the active layer. This makes it possible to further reduce the influence of the grain boundary of the active layer on operation of a semiconductor element, thus allowing an improvement in TFT characteristic of the semiconductor element.

In the method for manufacturing a semiconductor element, it is preferable that the impurities are sulfur.

According to the above arrangement, ionized sulfur is added more in concentration to the grain boundary which has low crystallinity in the polycrystalline ZnO film. As such, it is possible to intensively add sulfur to the grain boundary part of the active layer. In other words, sulfur of high concentration are added to the grain boundary part of the active layer. Therefore, according to the above arrangement, ZnS is formed more in concentration in the grain boundary part of the active layer than in the crystal part of the active layer. Since ZnS has a larger energy bandgap than ZnO, a trap level formed on the grain boundary of the active layer can be raised to be within the conduction band. This eliminates the influence of the trap level of the grain boundary on carriers, thus allowing an improvement in subthreshold characteristic of a semiconductor element.

In the method for manufacturing a semiconductor element, it is preferable that the solution has pH of 9 to 12.

According to the above arrangement, a solution used for adding sulfur to the polycrystalline ZnO film has pH of 9 to 12. Under such a pH condition, it is possible to prevent the polycrystalline ZnO film to which sulfur is added from dissolving during adding of sulfur to the polycrystalline ZnO film. This allows sulfur to be effectively added to the polycrystalline ZnO film.

In the method for manufacturing a semiconductor element, it is preferable that the solution contains ammonia, $ZnSO_4$, and thiourea.

According to the above arrangement, $ZnSO_4$ serves as a Zn precursor for preventing dissolution of Zn from a polycrystalline ZnO film. The following description deals with this in more detail. In an alkaline solution having pH of 7 or more, Zn exists as $Zn(OH)_2$ or $Zn^{2+}$. Therefore, in a case where Zn does not exist in the solution, Zn dissolves from the polycrystalline ZnO film as shown in FIG. 9. However, according to the above arrangement, $ZnSO_4$ is contained in the solution. As such, $ZnSO_4$ serves as a Zn source instead of the polycrystalline ZnO film. This makes it possible to prevent dissolution of Zn from the polycrystalline ZnO film.

Further, thiourea serves as a sulfur precursor. Furthermore, ammonia serves as a complexing agent. A complex is formed by the complexing agent and Zn so as to suppress generation of $Zn(OH)_2$ during adding of sulfur. The following reaction occurs in the solution.

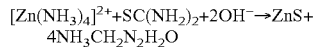

$$[Zn(NH_3)_4]^{2+} + SC(NH_2)_2 + 2OH^- \rightarrow ZnS + 4NH_3CH_2N_2H_2O$$

That is, it is possible to add sulfur to the polycrystalline ZnCO film by using the solution. As described above, formation of ZnS in a grain boundary part of an active layer eliminates influence, on carriers, of a trap level of the grain boundary of the active layer. As a result, it is possible to improve a subthreshold characteristic of a semiconductor element.

In the method for manufacturing a semiconductor element, it is preferable that the polycrystalline ZnO film is formed by an electroless plating. Further, it is preferable that formation of the polycrystalline ZnO film and addition of the impurities to the polycrystalline ZnO film are alternated more than once by use of the electroless plating.

According to the above arrangement, formation of the polycrystalline ZnO film and adding of the impurities into the polycrystalline ZnO film are alternated more than once with the use of the electroless plating. This allows the impurities to be uniformly added to a grain boundary of the polycrystalline ZnO film. Further, according to the above arrangement, it is possible to form a polycrystalline ZnO film without using a vacuum apparatus. This allows a reduction in manufacturing cost of the semiconductor element.

Further, in the method for manufacturing a semiconductor element, it is preferable that formation of the polycrystalline ZnO film and adding of the impurities into the polycrystalline ZnO film are alternated more than once by use of the electroless plating.

The above arrangement allows a distribution of the impurities in the active layer to be uniform in a film thickness direction of the active layer in a semiconductor element to be obtained.

In order to attain the above object, an electronic device of the present invention includes the semiconductor element of the present invention as a switching element.

According to the above arrangement, a switching element provided in the electronic device is made of a high-performance semiconductor element of the present invention which uses transparent ZnO as an active layer. This makes it possible to easily improve performance of the electronic device.

It is preferable that the electronic device is arranged such that the switching element is connected to a pixel electrode so that an image signal is written into or read out from a pixel electrode.

According to the above arrangement, the semiconductor element of the present invention is used as a switching element used for displaying an image and reading an image.

In an active matrix display device such as a liquid crystal display device and an organic EL display device, a switching element is turned on when an image signal is written from a driving circuit into a pixel electrode. Further, in an image reading apparatus such as an image sensor, a switching element is turned on when a pixel signal in a pixel electrode is read out. That is, according to the above arrangement, it is possible to realize (i) an active matrix display device including a semiconductor element of the present invention as a switching element and (ii) an image reading apparatus including a semiconductor element of the present invention as a switching element. Therefore, it is possible to easily enhance performance of an electronic device such as an active matrix display device and an image reading apparatus.

As described above, a semiconductor element of the present invention includes as an active layer a polycrystalline ZnO film in which impurities are added more in concentration to a grain boundary part than to a crystal part. This allows an energy level of a trap level formed on a grain boundary of the active layer to be shifted to a level which does not influence an energy level of carriers. This allows a reduction in influence of the grain boundary on operation of a semiconductor element, thus allowing an improvement in TFT characteristic of the semiconductor element such as electron field-effect mobility and subthreshold coefficient S.

BRIEF DESCRIPTION OF DRAWINGS

FIG. 7 (b) is a graph showing a voltage-resistivity characteristic of a thin-film transistor of each of the Examples 2 and 3, and the Comparative Example 1.

FIG. 8 (b) is a graph showing a voltage-resistivity characteristic of a thin-film transistor of each of the Examples 4 and 5, and the Comparative Example 2.

DESCRIPTION OF EMBODIMENTS

The inventors of the present invention have pursued their studies and focused on a double-Schottky barrier formed due to a grain boundary of polycrystalline ZnO in order to realize an enhanced high-efficiency transistor in which the polycrystalline ZnO is used as a base. The inventors carried out a detailed analysis with the use of a device simulator as to how the transistor in which the polycrystalline ZnO is used as a base operates. The detailed analysis demonstrated that carrier scattering from the double Schottky barrier of the grain boundary in the polycrystalline active layer is a dominant factor determining characteristics in a subthreshold region. Further, the detailed analysis also demonstrated that the carrier scattering from the double Schottky barrier can be understood as barrier height modulation caused by a gate voltage. Furthermore, comparisons between respective simulation results and respective device characteristics obtained in experiments demonstrated that a trap level which causes the transistor to inappropriately operate is located 0.2 eV below a conduction band.

As a result of diligent studies based on this original findings, the inventors found out that it is possible to realize a semiconductor element in which polycrystalline ZnO is used as a base and has a good subthreshold characteristic, by adding specific impurities more to a grain boundary part of an active layer than to a crystal part of the active layer. Based on the findings, the inventors arrived at the present invention.

An embodiment of the present invention is described below with reference to FIGS. 1 through 5. Note however that the present invention is not limited to this.

Embodiment 1

Figure 1:
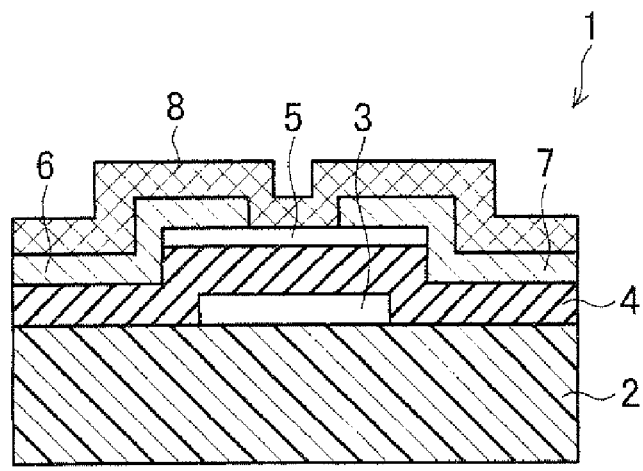
FIG. 1 is a cross-sectional view illustrating an arrangement of a thin-film transistor of the Embodiment 1 of the present invention.

As shown in FIG. 1, a thin-film transistor 1 of the present embodiment includes an insulating substrate 2, a gate electrode 3, a gate insulating layer 4, a semiconductor layer 5, a source electrode 6, a drain electrode 7, and a protection layer 8. The gate electrode 3 is provided on the insulating substrate 2. The semiconductor layer 5 is provided so as to be stacked above the gate electrode 3 via the gate insulating layer 4. Further, the source electrode 6 and the drain electrode 7 are provided, as respective electrode sections, on the semiconductor layer 5. The source electrode 6 and the drain electrode 7 are connected to each other via the semiconductor layer 5. Furthermore, the protection layer 8 is provided so as to cover the semiconductor layer 5, the source electrode 6, and the drain electrode 7. That is, the thin-film transistor 1 has an inversely staggered structure.

Further, in a case where the thin-film transistor 1 is used in a display device (e.g. a later described active matrix liquid crystal display device of the Embodiment 2), the drain electrode 7 is connected to a pixel electrode, or is made of a transparent conductive film so as to be integral with the pixel electrode. For this reason, the drain electrode 7 is partially drawn out from the protection layer 8.

The following description deals with components constituting the thin-film transistor 1.

The insulating substrate 2 can be any substrate which has an insulating property, and is therefore not limited to a specific one. For example, a glass substrate, a quartz substrate, or a plastic substrate can be used as the insulating substrate 2.

The gate electrode 3 is provided on the insulating substrate 2. A material of which the gate electrode 3 is made is not limited to a specific one, and can be, for example, tantalum (Ta), aluminum (Al), or chromium (Cr). Further, the thickness of the gate electrode 3 is not limited to a particular one.

If necessary, a pattern can be provided on the gate electrode 3, or a gate wire connected to the gate electrode 3 can be provided on the gate electrode 3.

The gate insulating layer 4 is provided on the gate electrode 3. A material of which the gate insulating layer 4 is made can be any insulating material, and is therefore not limited to a specific one. Examples of the material of which the gate insulating layer 4 is made include $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, or $(Li_{1-(x+y)}Na_xK_y)(Ga_{1-z}Al_z)O_2$ (a mixed crystal system of $LiGaO_2$). The gate insulating layer 4 can be made of one of these materials alone, or can be made of a solid solution containing at least two of these materials.

Further, the gate insulating layer 4 can have a monolayer structure of one of the above materials, or can be a multilayer structure in which a plurality of layers each made of different material or a plurality of layers each made of a single material are stacked. Specifically, for example, a gate insulating layer 4 can be arranged so that two layers, i.e., a first insulating layer 4a and a second insulating layer 4b, are stacked. In such a multilayer structure, it is possible that the gate insulating layer 4 secures, on the insulating substrate 2, its high reliability in a case where (i) the first insulating layer 4a is made of an insulating material (e.g. $Al_2O_3$, AlN, or MgO) which allows a good interface property in the boundary surface between the first insulating layer 4a and the semiconductor layer 5 and (ii) the second insulating layer 4b is made of an insulating material which has a good insulation property (e.g. $SiO_2$). Further, the thickness of the gate insulating layer 4 is not limited to a particular one.

The semiconductor layer 5, serving as an active layer, is made of a polycrystalline ZnO film (polycrystalline zinc oxide film) to which impurities are added, and is provided on the gate insulating layer 4. The present embodiment deals with an arrangement in which a polycrystalline ZnO film is used as a base material of the semiconductor layer 5. However, a film other than a polycrystalline ZnO film also can be used as the base material. For example, the following films can be used as the base material: a polycrystalline $Mg_xZn_{1-x}O$ (0<x<1) film, an amorphous ZnO film, an amorphous $Mg_xZn_{1-x}O$ (0<x<1) film, a ZnO film in which polycrystalline ZnO and amorphous ZnO are mixed, and a $Mg_xZn_{1-x}O$ (0<x<1) film in which polycrystalline $Mg_xZn_{1-x}O$ and amorphous $Mg_xZn_{1-x}O$ are mixed. Further, a monovalent element, a trivalent element, a quadrivalent element, a pentavalent element, or a heptavalent element can be added to the $Mg_xZn_{1-x}O$ (0<x<1) film.

The impurity is not limited to a specific one, provided that ZnM (M indicates an element which serves as an impurity) has a band gap larger than ZnO. Specifically, such an impurity can be a monovalent element, a trivalent element, a quadrivalent element, a pentavalent element, or a heptavalent element. In the present embodiment, sulfur is preferably used as the impurity. ZnS has a band gap larger than ZnO, and therefore can be suitably used in the present invention.

The semiconductor layer 5 contains impurities more in a grain boundary part of a polycrystalline ZnO film than in a crystal part of the polycrystalline ZnO film. This allows an improvement in TFT characteristics. The following description deals with how a TFT characteristic is improved in more detail. A trap level is formed at a grain boundary of a polycrystalline ZnO film. The trap level is caused by a Zn dangling bond. In a case where impurities such as sulfur are added to the polycrystalline ZnO film, sulfur is combined with a Zn dangling bond so that a Zn—S bond is formed. This causes an energy level of the trap level to be shifted to a higher energy side. As such, the trap level is hidden from carriers, thereby eliminating influence of the trap level on the carriers. Thus, a TFT characteristic can be improved.

In FIG. 1, the semiconductor layer 5 is completely covered by the protection layer 8. However, the semiconductor layer 5 can be partially exposed, provided that a channel region (a region in which carriers (movable charge) move) of the semiconductor layer 5 in the thin-film transistor 1 is not affected by atmosphere.

The source electrode 6 and the drain electrode 7 are provided on the semiconductor layer 5. If necessary, a pattern can be provided on the source electrode 6 and the drain electrode 7. A material of which the source electrode 6 is made, and a material of which the drain electrode 7 is made are not limited to a specific one. For example, tantalum (Ta), aluminum (Al), or chromium (Cr) can be used as such materials. The thickness of each of the source electrode 6 and the drain electrode 7 is not limited to a particular one.

The protection layer 8 covers the semiconductor layer 5 except for (i) a portion on which the source electrode 6 is provided (a portion which is covered by the source electrode 6), (ii) a portion on which the drain electrode 7 is provided (a portion which is covered by the drain electrode 7), (iii) a portion where a boundary surface between the semiconductor layer 5 and the gate insulating layer 4 exists. That is, the protection layer 8 covers (i) a portion of the semiconductor layer 5 which is located between the source electrode 6 and the drain electrode 7 and (ii) side surfaces of the semiconductor layer 5.

The protection layer 8 can be made of any insulating material, and is therefore not limited to a specific one. For example, the protection layer 8 may be made of an insulating material selected from $SiO_2$, $Al_2O_3$, AlN, MgO, $Ta_2O_5$, $TiO_2$, $ZrO_2$, stab-$ZrO_2$, $CeO_2$, $K_2O$, $Li_2O$, $Na_2O$, $Rb_2O$, $In_2O_3$, $La_2O_3$, $Sc_2O_3$, $Y_2O_3$, $KNbO_3$, $KTaO_3$, $BaTiO_3$, $CaSnO_3$, $CaZrO_3$, $CdSnO_3$, $SrHfO_3$, $SrSnO_3$, $SrTiO_3$, $YScO_3$, $CaHfO_3$, $MgCeO_3$, $SrCeO_3$, $BaCeO_3$, $SrZrO_3$, $BaZrO_3$, $LiGaO_2$, and $(Li_{1-(x+y)}Na_xK_y)(Ga_{1-z}Al_z)O_2$ (a mixed crystal system of $LiGaO_2$). The protection layer 8 can be made of a single one of these materials, or can be made of a solid solution containing at least two of these materials.

Alternatively, the protection layer 8 can be made of a resin such as acrylic. In a case where the protection layer 8 is made of a resin, the protection layer 8 can be formed with the use of an existing resin forming apparatus. That is, there is no need for a complicated film forming process for forming the protection layer 8. This makes it possible to more easily manufacture the thin-film transistor 1, and to reduce a manufacturing cost of the thin-film transistor 1. Further, the protection layer 8 made of a resin allows an increase in flexibility of the thin-film transistor 1, and is therefore especially suitable in a case where a flexible substrate is used as the insulating substrate 2.

Figure 2:
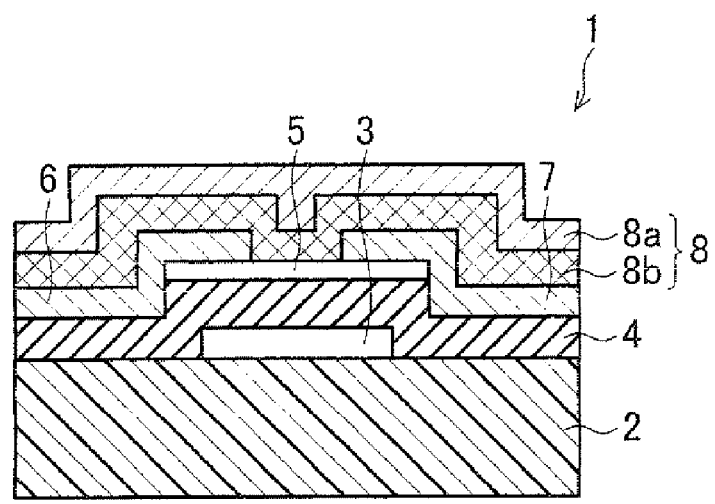
FIG. 2 is a cross-sectional view illustrating another arrangement of a thin-film transistor of the Embodiment 1 of the present invention.

Further, the protection layer 8 can have a monolayer structure, or can have a multilayer structure in which a plurality of layers of the insulating materials are stacked. As shown in FIG. 2, for example, a protection layer 8 can be arranged so that two layers, i.e., a first protection layer 8a and a second protection layer 8b are stacked. In such a structure, it is preferable that the first protection layer 8a is made of an insulating material (e.g. $Al_2O_3$, AlN, MgO) which allows a good interface property in the boundary surface between the first protection layer 8a and the semiconductor layer 5 and the second protection layer 8b is made of an insulating material (e.g. $SiO_2$) which has a good insulation property with the atmosphere. Such a multilayer structure allows the protection layer 8 to secure a higher reliability.

Figure 3:
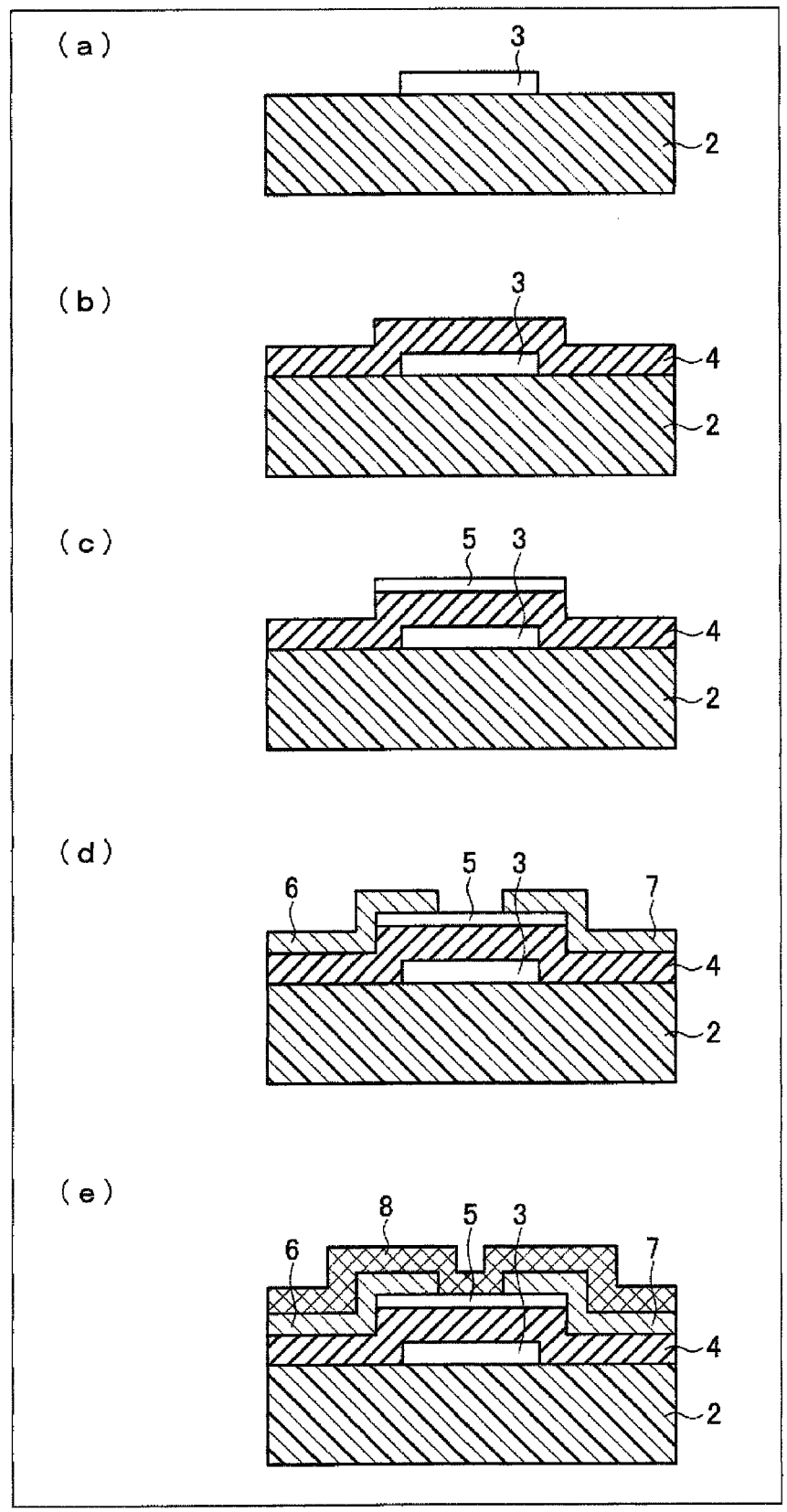
FIGS. 3(a) through (e) of FIG. 3 are cross-sectional views each illustrating a step of manufacturing the thin-film transistor of FIG. 1.

The following description deals with a method for manufacturing the thin-film transistor 1 of the present embodiment with reference to (a) through (c) of FIG. 3.

First, a material such as tantalum (Ta), aluminum (Al), or chromium (Cr) is formed on the insulating substrate 2 so as to have a thickness of approximately 300 nm with the use of a conventional thin-film forming method such as sputtering. Thus, the gate electrode 3 is formed (see (a) of FIG. 3).

If necessary, a pattern is formed on the gate electrode 3 with the use of a conventional method. For example, a resist pattern having a predetermined shape is prepared by a photolithography process. Next, dry etching is carried out with the use of the resist pattern in an atmosphere of $CF_4+O_2$ gas. Thus, it is possible to form the gate electrode 3 and gate wiring (not shown) connected to the gate electrode 3 which have been subjected to a patterning so as to have the same shape as that of the resist pattern.

Next, an insulating material having a thickness of approximately 500 nm is stacked on the gate electrode 3 with the use of a conventionally known method. Thus, the gate insulating layer 4 can be formed on the gate electrode 3 (see (b) of FIG. 3). It is possible to use any one of the insulating materials which were exemplified as a material of the gate insulating material 4. A method for stacking the insulating material on the gate electrode 3 is not limited to a specific one, and can therefore be any conventional thin-film forming method such as PVD or CVD. More specifically, examples of such a method include a pulse laser deposition method, an electroless plating method, a reactive sputtering method, a reactive plasma deposition method, a reactive ion plating method, or a plasma CVD method.

Subsequently to the formation of the gate insulating layer 4, polycrystalline ZnO is deposited so as to have a thickness of approximately 10 nm to 50 nm with the use of a conventional method. Thus, the semiconductor layer 5 made of a polycrystalline ZnO film is formed (see (c) of FIG. 3). The semiconductor layer 5 which has a thickness smaller than a thickness falling in the above range may cause a deterioration in transistor characteristic of a thin-film transistor to be obtained. A method for stacking the polycrystalline ZnO on the gate insulating layer 4 is not limited to a specific one, and can therefore be any conventional thin-film forming method such as PVD or CVD. More specifically, examples of such a method include a pulse laser deposition method, an electroless plating method, a reactive sputtering method, a reactive plasma deposition method, a reactive ion plating method, and a plasma CVD method. Among them, the pulse laser deposition method or the electroless plating method is preferably used, and the electroless plating is more preferably used. According to the electroless plating method, it is possible to repeatedly form a polycrystalline ZnO film and to repeatedly add impurities (later described). This allows the impurities to be uniformly added to a grain boundary of the polycrystalline ZnO film. Further, according to the electroless plating method, it is possible to form a polycrystalline ZnO film without using a vacuum apparatus. This allows a reduction in manufacturing cost.

After the formation of the semiconductor layer 5, impurities are added to the polycrystalline ZnO film so that the impurities are added more in concentration to a grain boundary part of the polycrystalline ZnO film than to a crystal part of the polycrystalline ZnO film. The semiconductor layer 5 to which the impurities are thus added serves as an active layer in the thin-film transistor 1 of the present embodiment. That is, the active layer of the thin-film transistor 1 is made of polycrystalline ZnO film to which the impurities are added, and the impurities are added more in concentration to the grain boundary part of the active layer than to the crystal part of the active layer.

A method for adding the impurities to the semiconductor layer 5 is not limited to a specific one. However, it is preferable to employ a method in which a polycrystalline ZnO film is immersed in a solution containing impurities so that the impurities are added to the semiconductor layer 5. The method allows the impurities to be added more in concentration to the rain boundary having low crystallinity. As such, it is possible to intensively add the impurities to the grain boundary of the polycrystalline ZnO film. In other words, the impurities of high concentration are added to the grain boundary of the polycrystalline ZnO film.

Specifically, a method for adding the impurities to the semiconductor layer 5 can be, for example, a chemical bath deposition method (hereinafter referred to also as "CBD method"), heat treatment in an atmosphere of carbon disulfide, or heat treatment in an atmosphere of mixture gas of carbon disulfide and inert gas (e.g. nitrogen, argon). In order to effectively add the impurities to the semiconductor layer 5, it is preferable to employ the CBD method among them, since the CBD method allows the impurities to be ionised in a solution. In a case where impurities are added to the semiconductor layer 5 with the use of the CBD method, a solution to be used is determined in accordance with the type of the impurities. For example, in a case where sulfur is used as the impurities, a generally used solution for formation of ZnS (zinc sulfide) film can be used as a base of the solution to be used. Specifically, for example, sulfur can be added to the polycrystalline ZnO film, in a case where a solution containing a Zn precursor which is for preventing dissolution of Zn from a polycrystalline ZnO film, a sulfur precursor, and a complexing agent is used as the solution. The Zn precursor can be, for example, $ZnSO_4$ or $ZnSO_4$ hydrate. The sulfur precursor can be, for example, $SC(NH_2)_2$ (thiourea). The complexing agent can be, for example, $NH_3$ (ammonia solution). Note that a complex is formed by the complexing agent and Zn so as to suppress generation of $Zn(OH)_2$ during addition of sulfur.

Further, concentrations of the Zn precursor, the sulfur precursor, and the complexing agent in the solution are determined in accordance with their respective types.

Further, it is preferable that pH of the solution is adjusted so that the polycrystalline ZnO film does not dissolve during the addition of sulfur. Specifically, it is preferable that the solution system has pH of 9 to 12.

Furthermore, it is preferable that the polycrystalline ZnO film is immersed in the solution for in the longest possible period of time. This allows sulfur to be added more in concentration to a grain boundary than to a crystal part.

The following description deals with what kind of reaction is caused in a case where sulfur is added to a polycrystalline ZnO film by use of the CBD method in a solution containing $ZnSO_4 \cdot 7H_2O$ (zinc sulfate heptahydrate), $SC(NH_2)_2$, and an ammonia solution.

Sulfur is added to the polycrystalline ZnO film in the solution by the COD method, so that ZnS is formed. ZnS is formed by the following reactions.

(A) A complex is formed by $Zn^{2+}$ and $NH_3$.

$$Zn^{2+}+4NH_3 \Leftrightarrow [Zn(NH_3)_4]^{2+} \quad (1)$$

(B) $NH_3$ is hydrolyzed, so that OH is generated.

$$NH_3+H_2O \Leftrightarrow NH_4^+ +OH^- \quad (2)$$

(C) $OH^-$ forms simple substances or $Zn(OH)_2$, and causes hydrolysis reaction of $SC(NH_2)_2$, so that sulfur ion is generated.

$$Zn^{2+}+2OH^- \Leftrightarrow Zn(OH)_2 \quad (3)$$

$$SC(NH_2)_2+2OH^- \Leftrightarrow S^{2-}+CH_2N_2+2H_2O \quad (4)$$

(D) The sulfur ion reacts with zinc hydroxide, so that ZnS is formed.

$$S^{2-}+Zn(OH)_2 \rightarrow ZnS+2OH^- \quad (5)$$

That is, formation of ZnS can be expressed by the following reaction formula.

$$[Zn(NH_3)_4]^{2+}+SC(NH_2)_2+2OH^- \rightarrow ZnS+ 4NH_3CH_2N_2+H_2O \quad (6)$$

According to the present invention, it is necessary that sulfur be added to a polycrystalline ZnO film under the condition that ZnO to which sulfur is added does not dissolve. Therefore, it is preferable that composition and concentration of a solution are adjusted so as to be included in an area C shown in FIG. 6 of later described Example 1. Under the condition, presence of $Zn(OH)_2$ and $[Zn(NH_3)_4]^{2+}$ in the solution can suppress elution of Zn from the polycrystalline ZnO film.

Next, a resist pattern having a predetermined shape is formed in a photolithography process on the semiconductor layer 5 made of a polycrystalline ZnO film to which the impurities are added. The resist pattern is subjected to wet etching using nitric acid, acetic acid, or the like so that the semiconductor layer 5 has a target shape.

Subsequently, a metal such as tantalum (Ta), aluminum (Al), or chromium (Cr) having a thickness of approximately 300 nm is deposited so as to form a metal layer on the semiconductor layer 5. A pattern is formed on the metal layer by photolithography and dry etching using $Cl_2$ gas. Thus, the source electrode 6 and the drain electrode 7 can be formed (see (d) of FIG. 3).

Furthermore, an insulating material having a thickness of approximately 200 nm is deposited on the source electrode 6 and the drain electrode 7 with the use of a conventional method so that an insulating material layer is formed. Such an insulating material can be one of the insulating materials exemplified as the insulating material of which the protection layer 8 is made. Further, a method for depositing the insulating material on the source electrode 6 and the drain electrode 7 is not limited to a particular one, and can therefore be, for example, a pulse laser deposition method. A predetermined resist pattern is prepared on the insulating material layer by a method such as photolithography. An unnecessary part of the insulating material is removed, with the use of the resist pattern, by a method such as ion milling. Thus, the protection layer 8 can be formed (see (e) of FIG. 3).

The method thus described in detail allows the thin-film transistor 1 of the present embodiment to be manufactured. Note that this method is one example of a method for manufacturing the thin-film transistor 1 of the present embodiment, and the present invention is not therefore limited to this.

The Embodiment 1 has dealt with an example in which the thin-film transistor 1 is used as a semiconductor element, but the present invention is not limited to this. The present invention can be also applied to a pn junction diode, a schottky diode, a bipolar transistor, a schottky-barrier field-effect transistor, and a junction field effect transistor, provided that impurities are added to a grain boundary of a polycrystalline ZnO film serving as an active layer.

Embodiment 2

Figure 4:
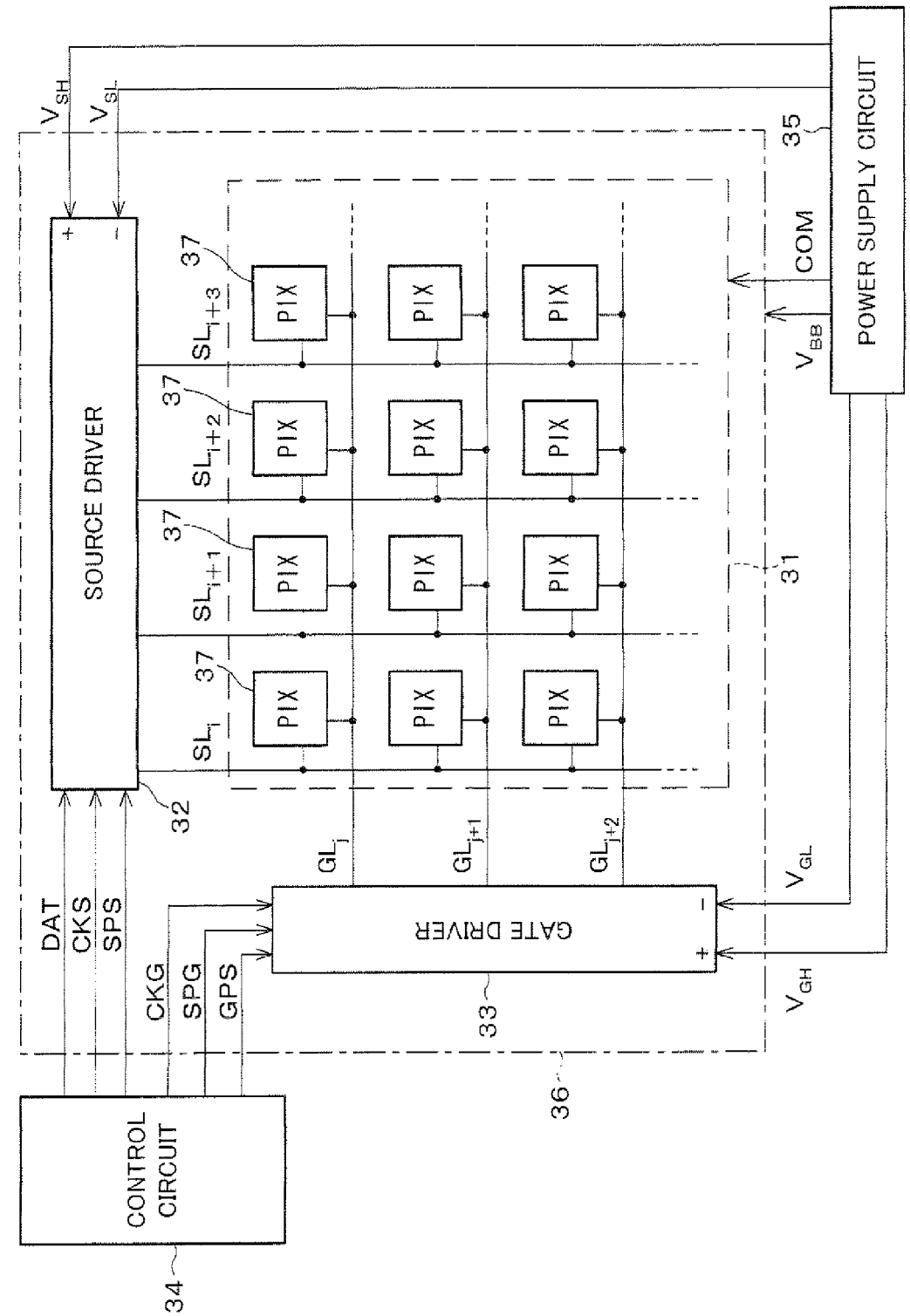
FIG. 4 is a block diagram schematically illustrating an arrangement of an active matrix liquid crystal display device of the Embodiment 2 of the present invention.
Figure 5:
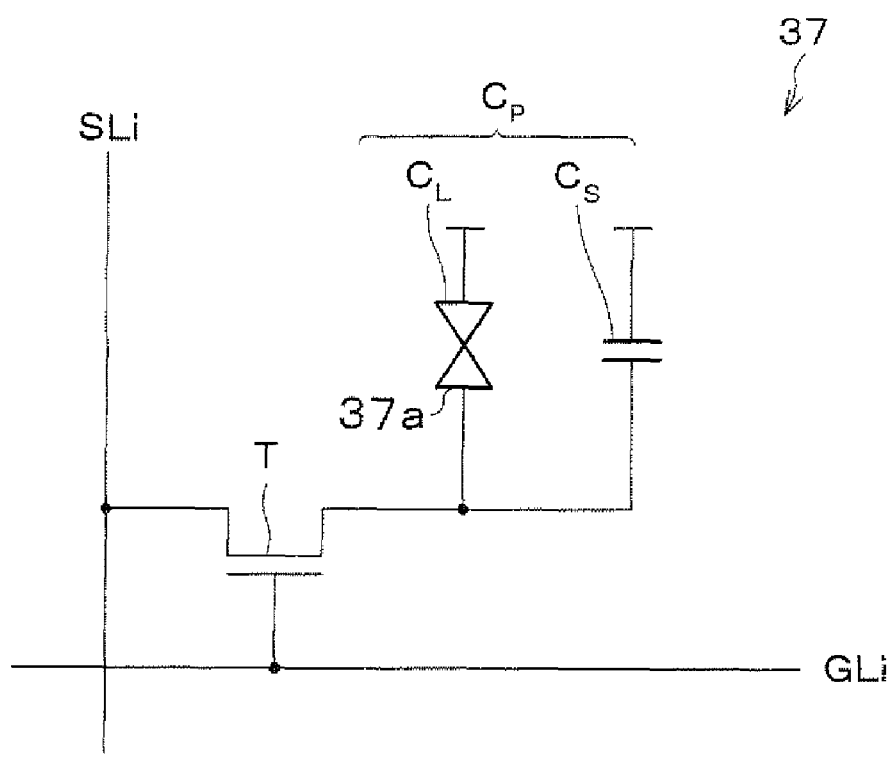
FIG. 5 is a circuit diagram illustrating an arrangement of a pixel in the liquid crystal display device of FIG. 4.

Another embodiment of the present invention is described below with reference to FIGS. 4 and 5. For convenience of explanation, constituents which have identical functions to those of the Embodiment 1 are given identical reference numerals, and are not explained repeatedly.

A display device 10 of the present embodiment is an active matrix liquid crystal display device. As shown in FIG. 4, the display device 10 includes a pixel array 31, a source driver 32, a gate driver 33, a control circuit 34, and a power supply circuit 35.

Each of the pixel array 31, the source driver 32, and the gate driver 33 is formed on a substrate 36. The substrate 36 is made of a material having insulation properties and light-transmitting properties (e.g. glass). The pixel array 31 includes source lines SL, gate lines GL, and pixels 37.

In the pixel array 31, a plurality of gate lines $GL_j$, $GL_{j+1}$ . . . intersect with a plurality of source lines $SL_i$, $SL_{i+1}$ . . . , and a pixel 37 (PIX in FIG. 4) is provided in an area surrounded by two adjacent gate lines GL and two adjacent source lines SL. That is, the pixels 37 are arranged in a matrix manner in the pixel array 37. Note that a single source line SL is allotted to a single column of pixels 37, and a single gate line GL is allotted to a single line of pixels 37.

In a case of a liquid crystal display device, each of the pixels 37 is constituted by a transistor T which is a switching element, and a pixel capacitance $C_P$ which has a liquid crystal capacitance $C_L$. The pixel capacitance $C_P$ in an active matrix liquid crystal display device generally has an auxiliary capacitance $C_S$ provided in parallel with the liquid crystal capacitance $C_L$ in order to stabilize displayed images. The auxiliary capacitance $C_S$ is required for keeping to the minimum at least (i) the effects of the liquid crystal capacitance $C_L$ and a leak current of the transistor T, (ii) pixel potential fluctuation due to a parasitic capacitance which is the sum of a capacitance between a gate and a source of the transistor T and a capacitance between a pixel electrode and a signal line of the transistor T, and (iii) display data dependence of the liquid crystal capacitance $C_L$.

The gate of the transistor T is connected to the gate line $GL_j$. One electrode of the liquid crystal capacitance $C_L$ and one electrode of the auxiliary capacitance $C_S$ are connected to the source line $SL_i$ via the drain and the source of the transistor T. The electrode of the liquid crystal capacitance $C_L$ which is connected to the drain is a pixel electrode 37a. A liquid crystal cell is sandwiched between the other electrode of the liquid crystal capacitance $C_L$ and a counter electrode. Additionally, the other electrode of the auxiliary capacitance $C_S$ is connected to a common electrode line (not shown) shared by all pixels (in the case of a $C_S$ on Common structure), or is connected to an adjacent gate line GL (in the case of a $C_S$ on Gate structure).

Each of the plurality of gate lines $GL_j$, $GL_{j+1}$ . . . is connected to the gate driver 33, and each of the plurality of data signal lines $SL_i$, $SL_{i+1}$ . . . is connected to the source driver 32. The gate driver 33 operates with power supply voltages of $V_{GH}$ and $V_{GL}$ which are different in voltage level, and the source driver 32 operates with power supply voltages of $V_{SH}$ and $V_{SL}$ which are different in voltage level.

The source driver 32 carries out sampling of an image signal DAT supplied from the control circuit 34 in response to a synchronization signal CKS and a start pulse SPS supplied from the control circuit 34, and then supplies the image signal DAT thus sampled to the source lines $SL_i$, $SL_{i+1}$ . . . , each of which is connected to a corresponding column of pixels. The gate driver 33 generates gate signals, to be supplied to the gate lines $GL_j$, $GL_{j+1}$ . . . , each of which is connected to a corresponding line of pixels 37, in response to synchronization signals CKG, GPS, and a start pulse GPS which are supplied from the control circuit 34.

The power supply circuit 35 generates the power supply voltages $V_{SH}, V_{SL}, V_{GH}, V_{GL}$, a ground potential COM, and a voltage $V_{BB}$. The power supply voltages $V_{SH}$ and $V_{SL}$, which are different in voltage level, are supplied to the source driver 32. The power supply voltages $V_{GH}$ and $V_{GL}$, which are different in voltage level, are supplied to the gate driver 33. The ground potential COM is supplied to the common electrode line (not shown) provided on the substrate 36.

The transistor T is turned on by a corresponding gate signal supplied via a Gate line $GL_j$ from the gate driver 33, and causes a corresponding image signal, which is supplied via a source line $SL_{i+1}$ from the source driver 32, to be written into a corresponding pixel 37 (pixel electrode 37a). Note that the transistor T is the thin-film transistor 1 of the Embodiment 1 (see FIG. 1). Since the thin-film transistor 1 includes an improvement in electron field-effect mobility and subthreshold coefficient S, a liquid crystal display device to which the thin-film transistor 1 is applied can include an improvement in display performance. As such, the thin-film transistor 1 can be suitably used as the transistor T for driving the corresponding pixel 37.

Further, in a case where some of circuit elements configuring each of the source driver 32 and the gate driver 33 are configured by a transistor(s), the thin-film transistor 1 can be used as such a transistors).

Furthermore, in a case where each of (i) transistors T for respective pixels 37 and (ii) transistors for respective driving circuits is configured by a thin-film transistor 1, it is possible to simultaneously form the transistors (i) and (ii) on a single substrate 36 with the use of a single process. This causes a reduction in the number of steps for manufacturing a matrix display device, thereby allowing a reduction in cost for manufacturing the matrix display device.

As described above, the thin-film transistor 1 includes an improvement in electron field-effect mobility and subthreshold coefficient S. In view of this, in a case where the thin-film transistor 1 is used as an active matrix element such as a liquid crystal display element driven at high speed or an organic EL display element driven at high speed, the active matrix element includes an improvement in display performance.

The Embodiment 2 has dealt with an example in which an active matrix liquid crystal display device is used as the electronic device of the present invention. However, other display devices such as an organic EL display device and a flexible display device fall within the scope of an electronic device in accordance with the present invention, provided that each of switching elements is configured by a thin-film transistor 1.

Further, examples of electronic devices other than the display devices to which a semiconductor element of the present invention can be applied include devices, such as a line image scanner, a matrix image scanner, and an x-ray image sensor, in which the thin-film transistor 1 is used as each of switching elements for reading out an image. In each of the scanners and the sensor, the charge stored by a charge storage capacitance can be read out by turning on a corresponding switching element, provided between a corresponding pixel electrode and a corresponding source line, in response to a gate voltage of the corresponding switching element (a scanning signal) which is supplied to a corresponding gate line. In a case where the liquid crystal capacitance $C_L$ and the auxiliary capacitance $C_S$ in each of the pixels 37 of the liquid crystal display device shown in FIG. 4 are replaced by respective charge storage capacitances, it is possible to configure a section, provided in each of the scanners and the sensor each of which includes transistors T as the respective switching elements, for reading out an image signal. According to this arrangement, the source driver 32 is replaced by an input circuit for receiving an image signal read out from a pixel. Further, in case of the line image scanner, one line of pixels is used.

The present invention is not limited to the configurations above, but may be altered in many ways by a skilled person in the art within the scope of later described claims. An embodiment derived from any proper combination of technical means disclosed in different embodiments is encompassed in the technical scope of the present invention.

EXAMPLES

Figure 6:
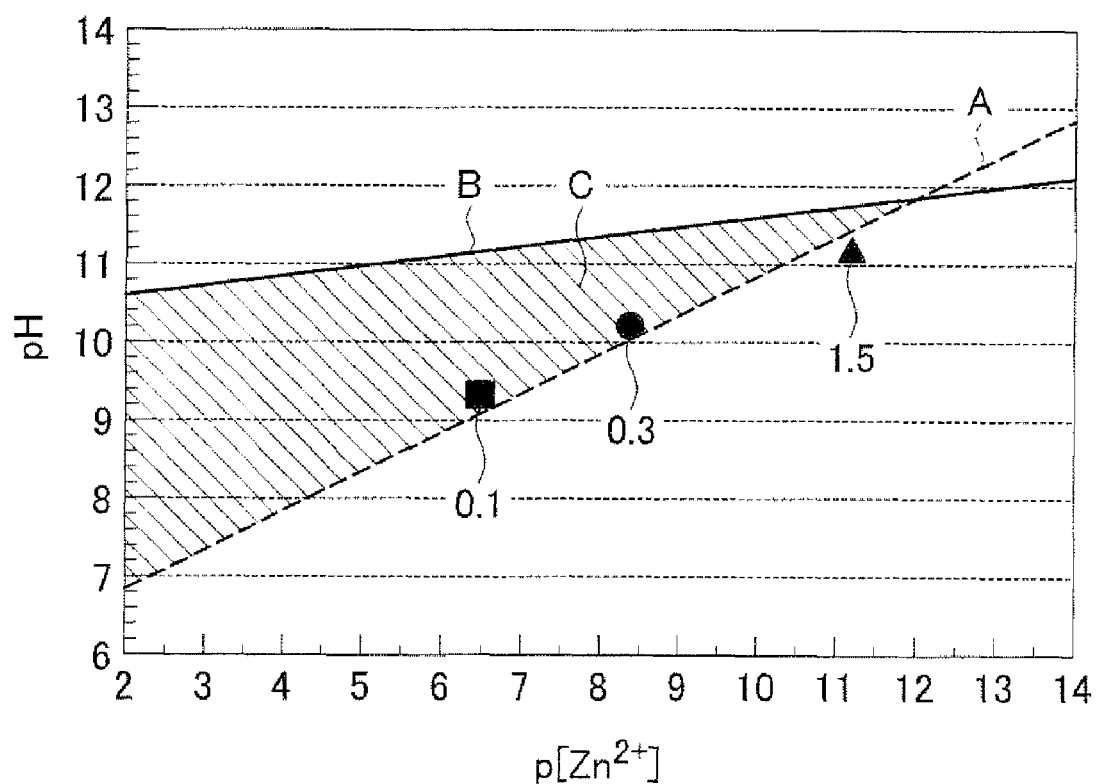
FIG. 6 is a state diagram showing Zn concentration dependence of pH of a solution in which sulfur adding treatment is carried out, ammonia concentration, and pH during the sulfur adding treatment in the Example 1 of the present invention.
Figure 7A:
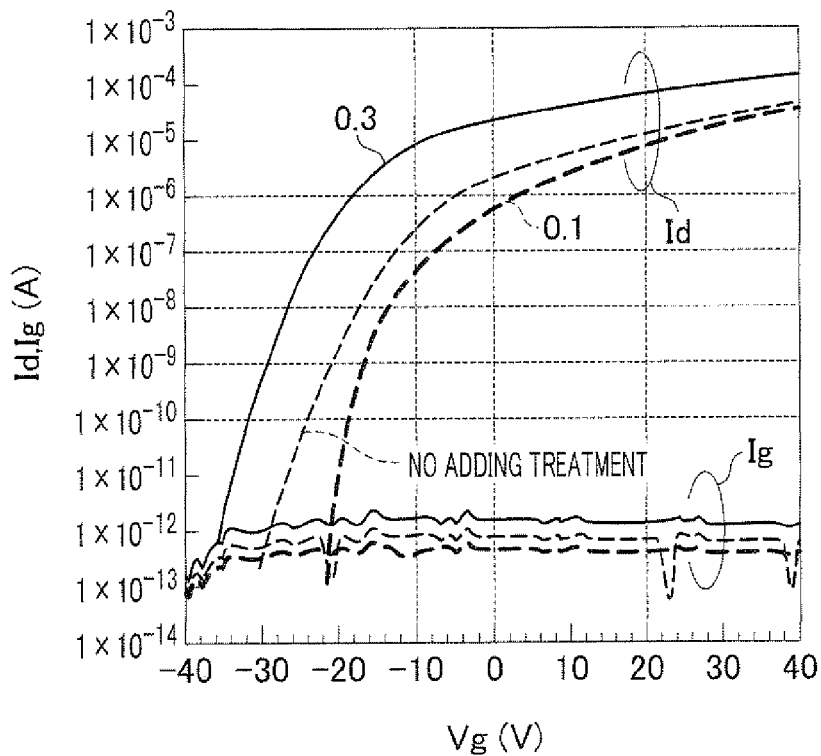
FIG. 7 (a) is a graph showing an Id-Vg characteristic of a thin-film transistor of each of the Examples 2 and 3, and the Comparative Example 1.
Figure 7B:
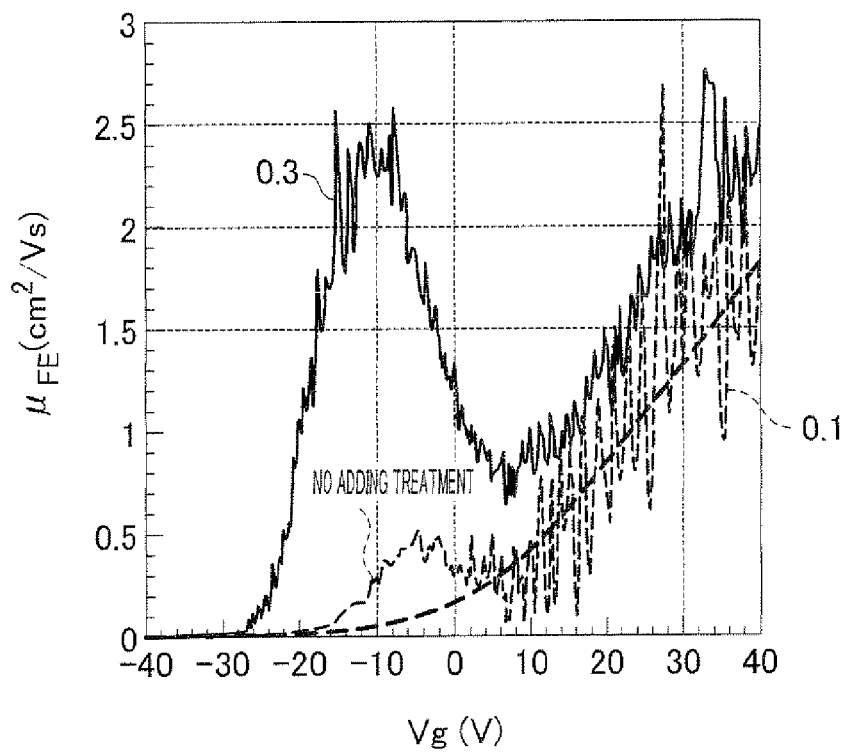
Figure 8A:
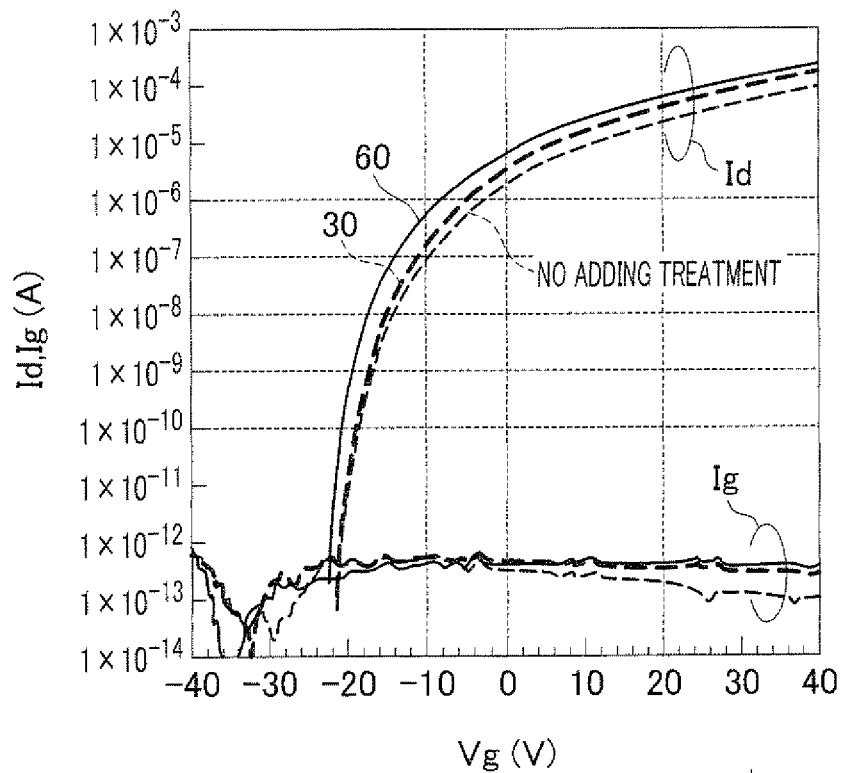
FIG. 8 (a) is a graph showing an Id-Vg characteristic of a thin-film transistor of each of the Examples 4 and 5, and the Comparative Example 2.
Figure 8B:
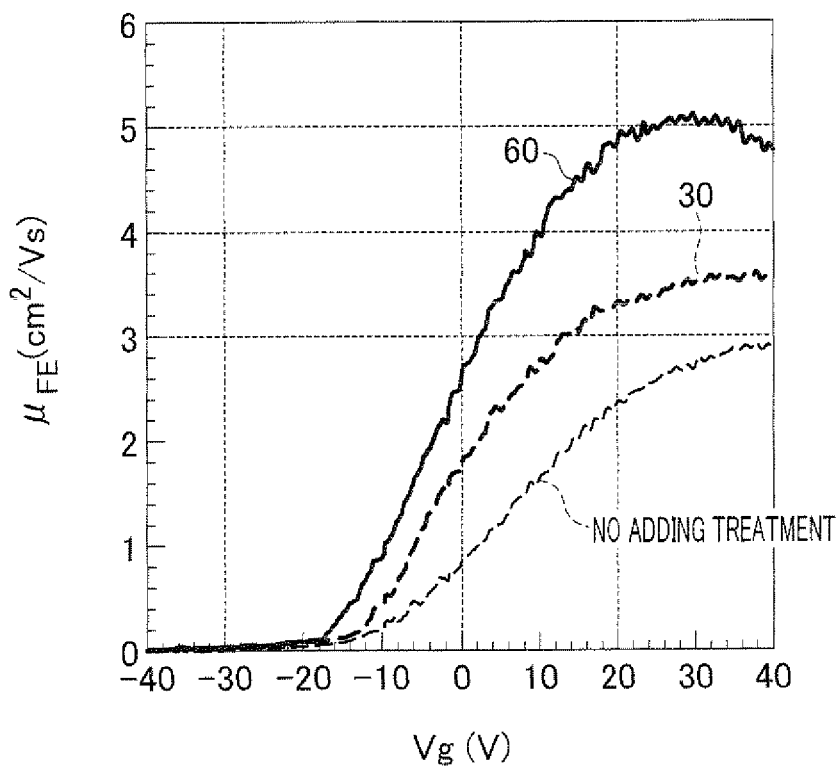
Figure 9:
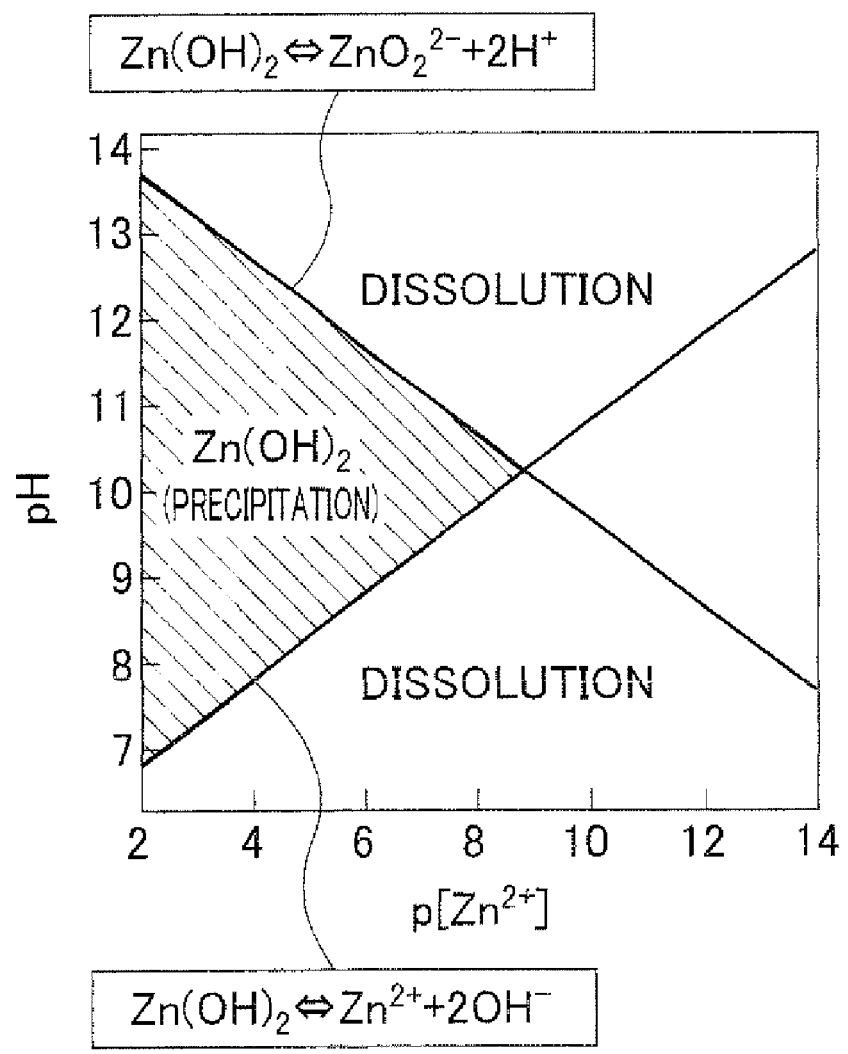
FIG. 9 is a diagram showing a relationship between $Zn^{2+}$ and pH in a solution.

The present invention is described more concretely with reference to Examples, Comparative Examples, and FIGS. 6 through 8. However, the present invention is not limited to the following description, but may be altered or modified by a skilled person within the scope of the claims. Note that, in each of the Examples and the Comparative Examples, an Id-Vg characteristic, a Vg dependency of electron field-effect mobility, and TFT characteristics (electron field-effect mobility and subthreshold coefficient S) were evaluated as below.

[Id-Vg characteristic, Vg dependency of electron field-effect mobility, and TFT characteristics (electron field-effect mobility and subthreshold coefficient S)]

A drain current characteristic of a transistor can be expressed by the following expression (1).

$$I_d = \frac{1}{2} \cdot \frac{\mu C_i W}{L}(V_g - V_{th})^2$$

Id: Drain current
Ci: Gate insulating film capacitance
W: Channel width
L: Channel length
Vg: Gate voltage The expression (1) can be changed into the following expression (2) expressed by electron field-effect mobility.

$$I_d = \frac{1}{2} \cdot \frac{\mu C_i W}{L}(V_g - V_{th})^2$$

$$\mu = \frac{2L}{C_i W(V_g - V_{th})^2} I_d$$

$$= \frac{2L}{C_i W} \cdot \frac{\left(I_d^{\frac{1}{2}}\right)^2}{(V_g - V_{th})^2}$$

$$= \frac{2L}{C_i W} \cdot \left(\frac{I_d^{\frac{1}{2}}}{V_g - V_{th}}\right)^2$$

$$\mu = \frac{2L}{C_i W} \cdot \left(\frac{\Delta I_d^{\frac{1}{2}}}{\Delta V_g}\right)^2$$

Id: Drain current
Ci: Gate insulating film capacitance
W: Channel width
L: Channel length
Vg: Gate voltage
u: Electron field-effect mobility That is, electron field-effect mobility can be expressed by a ratio between the square root of a difference of a drain current and a difference of a gate voltage.

In each of the Examples and the Comparative Examples, a transfer characteristic of the transistor (Id-Vg characteristic) was evaluated by measuring a drain current obtained under a condition that a gate voltage is changed from −40V to +40V while a source voltage is kept to be a ground potential and a drain voltage is set to 10V.

A Vg characteristic of the electron field-effect mobility was evaluated by obtaining a difference of Id and a difference of Vg at measurement points in the data (Id-Vg characteristic) thus measured.

A subthreshold coefficient S is expressed by the following expression (3).

$$S = \frac{dV_G}{d\log I_D}$$

Id: Drain current
Vg: Gate voltage
S: subthrethhold coefficient S

That is, the subthreshold coefficient S is defined as a gate voltage necessary for a single-digit change in drain current. As shown in FIGS. 7 (a) and 8 (a), the subthreshold coefficient S is indicated by a slope in a semilogarithmic plot in which Id is expressed by a single logarithmic axis and Vg is expressed by a linear axis. In this specification, a slope in a region where Id rises is taken as the subthreshold coefficient S.

Example 1

Study of Conditions Under which Impurities are Added to an Active Layer

A semiconductor element of the present invention includes an active layer in which impurities are added to polycrystalline ZnO film. That is, in manufacturing the semiconductor element of the present invention, it is necessary to add the impurities to the polycrystalline ZnO film. It is necessary that the impurities are added to the polycrystalline ZnO film under a condition such that ZnO of the polycrystalline ZnO film to which the impurities are added does not dissolve. In view of this, this example studied an adding condition under which sulfur was added to a polycrystalline ZnO film with the use of the CBD method so that ZnS was formed in a grain boundary. Used as a solution in the CBD method is a solution for forming ZnS (zinc sulfide) film which contains $ZnSO_4 \cdot 7H_2O$ (Zn precursor), $SC(NH_2)_2$ (sulfur precursor), and an ammonia solution (complexing agent).

FIG. 6 shows a relationship between concentration p of $Zn^{2+}$ ($[Zn^{2+}]$) and pH of a solution. In FIG. 6, mol concentration of $ZnSO_4 \cdot 7H_2O$ was set to 0.025 mol/l, and mol concentration of $SC(NH_2)_2$ was set to 0.035 mol/l. Further, in FIG. 6, the straight line A indicates $Zn^{2+} + 2OH^- \Leftrightarrow Zn(OH)_2$, and the straight line B indicates $Zn^{2+} + 4NH_3 \Leftrightarrow [Zn(NH_3)_4]^{2+}$. In an area C surrounded by the straight lines (the straight lines A and B), $Zn(OH)_2$ and $[Zn(NH_3)]^{2+}$ coexist in the solution. Therefore, in a case where a solution has a composition of the area C illustrated in FIG. 6, it is possible to prevent dissolution of ZnO while sulfur is added to a polycrystalline ZnO film.

In view of this, the inventors considered concentration of ammonia to be added as a complexing agent under a condition that mol concentration of $ZnSO_4 \cdot 7H_2O$ was kept to be 0.025 mol/l and mol concentration of $SC(NH_2)_2$ was kept to be 0.035 mol/l in the solution system.

A solution having an ammonia concentration of 0.1 mol/l had pH of 6.5, a solution having an ammonia concentration of 0.3 mol/l had pH of 8.4, and a solution having an ammonia concentration of 1.5 mol/l had pH of 11.2. As shown in FIG. 6, a solution having an $NH_3$ mol concentration of 1.5 mol/l had pH of 11.2 which was out of the area C. Further, under this condition, ZnO dissolved, and therefore sulfur could not be added to the polycrystalline ZnO film. In contrast, a solution having $NH_3$ mol concentration of 0.1 mol/l had pH of 6.5, and a solution having $NH_3$ mol concentration of 0.3 mol/l had pH of 8.4. That is, each of the solutions had pH which was within the area C of the FIG. 6. Further, under the conditions, sulfur was actually added to a polycrystalline ZnO film. This caused ZnO not to dissolve, and therefore immersion in the solution for thirty minutes allowed sulfur to be added to the polycrystalline ZnO film. The results demonstrates that it was possible to determine a composition of a solution used for adding impurities to an active layer based on FIG. 6.

Examples 2 through 5

Manufacture of a Thin-Film Transistors

A gate electrode was formed on an alkali-free glass substrate (insulating substrate) by sputtering and depositing Ta so that a Ta layer having a thickness of approximately 300 nm is formed. A resist pattern having a predetermined shape was formed on the gate electrode by use of a photolithography process. Next, dry etching was carried out with the use of the resist pattern in an atmosphere of $(CF_4+O_2)$ gas. Thus, (i) the gate electrode 3 which has patterned to have the shape of the resist pattern and (ii) gate wiring (not shown) connected to the gate electrode 3 were formed.

Next, a gate insulating layer was formed by depositing and layering $Al_2O_3$ having a thickness of approximately 500 nm with the use of a pulse laser deposition method. The thin-film of $Al_2O_3$ was formed under a condition that (i) the substrate temperature was 300° C., (ii) the thin-film was formed in the atmosphere of oxygen under reduced pressure, (iii) laser power was 3.0 J/cm$^2$, and (iv) a repetition frequency was 10 Hz.

Subsequently to the deposition of $Al_2O_3$, polycrystalline ZnO was deposited and layered with the use of the pulse laser deposition method. The polycrystalline ZnO was deposited under a condition that (i) the substrate temperature was 300° C., (ii) the polycrystalline ZnO film was formed in an atmosphere of a mixture of oxygen and nitrogen monoxide under reduced pressure, (iii) laser power was 1.1 J/cm$^2$, and (iv) repetition frequency was 10 Hz. Further, each thickness of the polycrystalline ZnO film in the Examples is shown in Table 1.

TABLE 1

| | Formation of ZnO Film | | Sulfur Adding Condition | | TFT Characteristic | |
| --- | --- | --- | --- | --- | --- | --- |
| | Film Thickness (nm) | Formation Method | $NH_3$ concentration (M) | Immersion Time (minute) | Electron Field-Effect Mobility (cm$^2$/Vs) | Value S (V/decade) |
| Example 2 | 50 | Pulse Laser Deposition | 0.3 | 30 | 2.29 | 1.83 |
| Example 3 | 50 | Pulse Laser Deposition | 0.1 | 30 | 1.84 | 1.16 |
| Example 4 | 25 | Pulse Laser Deposition | 0.3 | 60 | 5.11 | 0.97 |
| Example 5 | 25 | Pulse Laser Deposition | 0.3 | 30 | 3.39 | 1.06 |
| Example 6 | 50 | Electroless Plating | 0.3 | 30 | | |
| Comparative Example 1 | 50 | Pulse Laser Deposition | No Sulfur Adding Treatment | | 1.58 | 2.28 |
| Comparative Example 2 | 25 | Pulse Laser Deposition | No Sulfur Adding Treatment | | 2.64 | 1.52 |

Subsequently, sulfur was added to the polycrystalline ZnO film in the solution. The CBD method which allows sulfur to be introduced as ion into the solution was employed so that sulfur was effectively added to the polycrystalline ZnO film. A generally used solution for forming a ZnS (zinc sulfide) film was employed as a base of the solution. Specifically, a solution containing (i) $ZnSO_4 \cdot 7H_2O$ of 0.025 mol/l serving as a Zn precursor, (ii) $SC(NH_2)_2$ of 0.035 mol/l serving as a sulfur precursor, and (iii) $NH_3$ serving as a complexing agent which suppresses generation of $Zn(OH)_2$ due to complex formation was used so as to suppress dissolution of Zn from the polycrystalline ZnO film. Note that $NH_3$ concentration and immersion time shown in the Table 1 were used in each of the Examples.

Subsequently, a resist pattern having a predetermined shape was formed on the polycrystalline ZnO film to which sulfur was thus added, with the use of a photolithography process. This resist pattern was subjected to wet etching using nitric acid, acetic acid, or the like so that a semiconductor layer having a desired shape was formed.

Next, Al was deposited so as to form an Al layer having a thickness of approximately 200 nm by use of a sputtering method. The Al layer was subjected to patterning by carrying out dry etching in an atmosphere of $Cl_2$ gas with respect to the Al layer, with the use of photolithography so that a source electrode and a drain electrode were formed.

Furthermore, $Al_2O_3$ was deposited so as to form an $Al_2O_3$ layer having a thickness of approximately 200 nm by use of a pulse laser deposition method. An unnecessary portion of the $Al_2O_3$ layer was removed by a method such as ion milling, with the use of a predetermined resist pattern manufactured by photolithography. This caused a protection layer to be formed. Thus, a thin-film transistor was obtained. With regard to the thin-film transistor thus manufactured, (i) an Id-Vg characteristic, (ii) Vg dependency of field-effect mobility, and (iii) a TFT characteristic (electron field-effect mobility, sub-threshold coefficient S) were evaluated in accordance with the method described above. The results thus evaluated are shown in FIGS. 7 (a), 7 (b), 8 (a), and 8 (b), and the Table 1. Note that FIGS. 7 (a) and 8 (a) show the Id-Vg characteristic of the thin-film transistor, and FIGS. 7 (b) and 8 (b) show the Vg dependency of the field-effect mobility. Note further that, in FIGS. 7 (a) and 7 (b), "0.1" are related to the thin film transistor of the Example 2, and "0.3" are related to the thin film transistor of the Example 3. In FIGS. 8 (a) and 8 (b), "60" is related to the thin film transistor of the Example 4' and "30" is related to the thin film transistor of the Example 5.

Example 6

A thin-film transistor was manufactured in the same manner as the Example 2 except that a polycrystalline ZnO film was formed by electroless plating.

The polycrystalline ZnO film was formed by the electroless plating as follows: 0.01 mol/l dimethylamine borane (DMAB) serving as a reducing agent was added to a 0.5 mol/l zinc nitrate solution serving as a precursor of Zn, and has then been kept at a temperature of 50° C. for eight minutes. This caused a polycrystalline ZnO film having a thickness of 50 nm to be formed. Subsequently, sulfur was added to the polycrystalline ZnO film in the same manner as the Example 2. Thus, a thin-film transistor was manufactured. An Id-Vg characteristic, and Vg dependency of electron field-effect mobility of the thin-film transistor thus manufactured were evaluated. The results thus evaluated showed that TFT characteristics were improved as in the Example 2.

Comparative Example 1

A thin-film transistor was manufactured in the same manner as the Example 2, except that no sulfur is added. An Id-Vg characteristic, and Vg dependency of electron field-effect mobility of the thin-film transistor thus manufactured were evaluated. The results thus evaluated are shown in FIGS. 7 (a) and 7 (b). Note that the results obtained in the Comparative Example 1 are indicated by "no adding treatment" in FIGS. 7 (a) and 7 (b).

Comparative Example 2

A thin-film transistor was manufactured in the same manner as the Example 4, except that no sulfur is added. An Id-Vg characteristic, and Vg dependency of electron field-effect mobility of the thin-film transistor thus manufactured were evaluated. The results thus evaluated are shown in FIGS. 8 (a) and 8 (b). Note that the results obtained in the Comparative Example 2 are indicated by "no adding treatment" in FIGS. 8 (a) and 8 (b).

As is clear from a comparison between the Comparative Example 1 and respective of the Examples 2 and 3 (see FIGS. 7 (a) and 7 (b), and the Table 1), field-effect mobility and subthreshold coefficient S were improved in a case where sulfur was added. That is, it was found out that the addition of sulfur made by a solution technique was effective in improving TFT characteristics.

Further, as is clear from a comparison between the Example 2 and the Example 5, field-effect mobility and subthreshold coefficient S were more improved by reducing the thickness of a polycrystalline ZnO film. That is, it was found out that the TFT characteristics could be improved by reducing the thickness of a polycrystalline ZnO film. It is believed that this is because sulfur is more effectively added to a polycrystalline film in a case where the polycrystalline ZnO film has a reduced thickness.

The present invention is not limited to the arrangements of the respective embodiments above, but may be altered by a skilled person in the art within the scope of the claims. An embodiment or example obtained by a proper combination of technical means disclosed in different embodiments or examples is also encompassed in the technical scope of the present invention.

INDUSTRIAL APPLICABILITY

As described above, according to the present invention, since a grain boundary part of an active layer contains more specific impurities than a crystal part of the active layer, influence of a grain boundary on operation of a semiconductor element is reduced. This allows an improvement in TFT characteristics. Therefore, the present invention is widely applicable to (i) a semiconductor element such as a thin-film transistor, a pn junction diode, a schottky diode, a bipolar transistor, a schottky-barrier field effect transistor, and a junction field-effect transistor, (ii) various semiconductor devices, (iii) various display devices such as an active matrix liquid crystal display device, an organic EL display device, and a flexible display device, and (iv) various electronic devices including semiconductor element and/or semiconductor device.

The invention claimed is:

1. A method for manufacturing a semiconductor element, comprising the steps of:
   forming a polycrystalline ZnO film, and
   forming an active layer by adding impurities to the polycrystalline ZnO film so that the impurities are added more in concentration to a grain boundary part than to a crystal part,
   wherein the active layer is formed by immersing the polycrystalline ZnO film in a solution containing the impurities which are being ionized so that the impurities are added more in concentration to the grain boundary part than to the crystal part,
   wherein the impurities are sulfur, and
   wherein the solution contains ammonia, $ZnSO_4$, and thiourea.

2. A method for manufacturing a semiconductor element, comprising the steps of:
   forming a polycrystalline ZnO film, and
   forming an active layer by adding impurities to the polycrystalline ZnO film so that the impurities are added more in concentration to a grain boundary part than to a crystal part,
   wherein formation of the polycrystalline ZnO film and addition of the impurities to the polycrystalline ZnO film are alternated more than once by use of the electroless plating.

* * * * *